United States Patent
Xie et al.

(10) Patent No.: US 10,014,370 B1
(45) Date of Patent: Jul. 3, 2018

(54) AIR GAP ADJACENT A BOTTOM SOURCE/DRAIN REGION OF VERTICAL TRANSISTOR DEVICE

(71) Applicant: GLOBALFOUNDRIES Inc., Grand Cayman (KY)

(72) Inventors: Ruilong Xie, Niskayuna, NY (US); Chun-Chen Yeh, Danbury, CT (US); Kangguo Cheng, Schenectady, NY (US); Tenko Yamashita, Schenectady, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/491,420

(22) Filed: Apr. 19, 2017

(51) Int. Cl.
*H01L 29/06* (2006.01)
*H01L 29/78* (2006.01)
*H01L 29/66* (2006.01)

(52) U.S. Cl.
CPC ...... *H01L 29/0653* (2013.01); *H01L 29/6653* (2013.01); *H01L 29/66553* (2013.01); *H01L 29/66666* (2013.01); *H01L 29/7827* (2013.01)

(58) Field of Classification Search
CPC ......... H01L 21/02054; H01L 21/30617; H01L 21/30621; H01L 21/31144; H01L 21/3213; H01L 21/31055; H01L 21/31116; H01L 21/31138; H01L 21/32135; H01L 21/67069; H01L 21/32136; H01L 21/2633; H01L 21/3065; H01L 2021/60105; H01L 21/31056; H01L 21/76808; H01L 21/30608; H01L 21/7681; H01L 21/76811; H01L 21/76224; H01L 21/764; H01L 21/76289; H01L 29/0653; H01L 29/66553; H01L 29/66666; H01L 29/7827; H01L 29/6653
See application file for complete search history.

(56) References Cited

U.S. PATENT DOCUMENTS

| | | |
|---|---|---|
| 5,342,797 A | 8/1994 | Sapp et al. |
| 5,414,289 A | 5/1995 | Fitch et al. |
| 6,372,559 B1 | 4/2002 | Crowder et al. |

(Continued)

OTHER PUBLICATIONS

Notice of Allowance from related application U.S. Appl. No. 15/132,383 dated Jul. 21, 2017.

(Continued)

*Primary Examiner* — Sonya D McCall Sheppard
(74) *Attorney, Agent, or Firm* — Amerson Law Firm, PLLC

(57) ABSTRACT

One illustrative method disclosed herein includes, among other things, forming an initial bottom spacer above a semiconductor substrate and adjacent a vertically-oriented channel semiconductor (VOCS) structure and forming a gate structure around the VOCS structure and above the initial bottom spacer. In this example, the method also includes performing at least one etching process to remove at least a portion of the initial bottom spacer that is positioned vertically under the gate structure so as to thereby result in the formation of an air gap that is positioned under the gate structure, wherein the air gap extends around at least a majority of a perimeter of the VOCS structure, and forming a replacement bottom spacer above the semiconductor substrate and adjacent the air gap.

14 Claims, 18 Drawing Sheets

View X-X

View Y-Y

(56) References Cited

U.S. PATENT DOCUMENTS

| | | |
|---|---|---|
| 6,686,604 B2 | 2/2004 | Layman et al. |
| 6,690,040 B2 | 2/2004 | Chaudhry et al. |
| 6,759,730 B2 | 7/2004 | Chaudhry et al. |
| 7,241,655 B2 | 7/2007 | Tang et al. |
| 7,465,622 B2 | 12/2008 | Lin |
| 7,666,733 B2 | 2/2010 | Delconibus |
| 7,700,432 B2 | 4/2010 | Chaudhry et al. |
| 8,637,849 B2 | 1/2014 | Deligianni et al. |
| 9,177,785 B1 | 11/2015 | Kelly et al. |
| 9,224,840 B2 | 12/2015 | Flachowsky et al. |
| 9,278,362 B2 | 3/2016 | Basu et al. |
| 9,306,022 B1 * | 4/2016 | Oh .................. H01L 29/4941 |
| 9,385,195 B1 | 7/2016 | Zhang |
| 9,530,863 B1 | 12/2016 | Zhang et al. |
| 9,530,866 B1 | 12/2016 | Zhang et al. |
| 9,640,636 B1 | 5/2017 | Bentley et al. |
| 9,660,028 B1 | 5/2017 | Cheng et al. |
| 9,812,443 B1 | 11/2017 | Cheng et al. |
| 2003/0047749 A1 | 3/2003 | Chaudhry et al. |
| 2003/0119237 A1 | 6/2003 | Chittipeddi et al. |
| 2007/0111414 A1 | 5/2007 | Chaudhry et al. |
| 2008/0054350 A1 | 3/2008 | Breitwisch et al. |
| 2009/0085088 A1 | 4/2009 | Takaishi |
| 2010/0171163 A1 | 7/2010 | Kim et al. |
| 2011/0253981 A1 | 10/2011 | Rooyackers et al. |
| 2013/0341270 A1 | 12/2013 | Kar et al. |
| 2014/0353593 A1 | 12/2014 | Smets |
| 2015/0091100 A1 | 4/2015 | Xie et al. |
| 2015/0137271 A1 | 5/2015 | Cai et al. |
| 2016/0005850 A1 | 1/2016 | Zhao et al. |
| 2016/0284712 A1 | 9/2016 | Liaw |
| 2016/0365456 A1 | 12/2016 | Liu et al. |
| 2017/0229472 A1 | 8/2017 | Lu et al. |

OTHER PUBLICATIONS

Hergenrother et al., "The Vertical Replacement-Gate (VRG) MOSFET: A 50-nm Vertical MOSFET with Lithography-Independent Gate Length," IEDM 99-75, IEEE 1999.

Office Action from related U.S. Appl. No. 15/445,392 dated Feb. 21, 2018.

Office Action from related U.S. Appl. No. 15/268,796 dated Jan. 12, 2018.

* cited by examiner

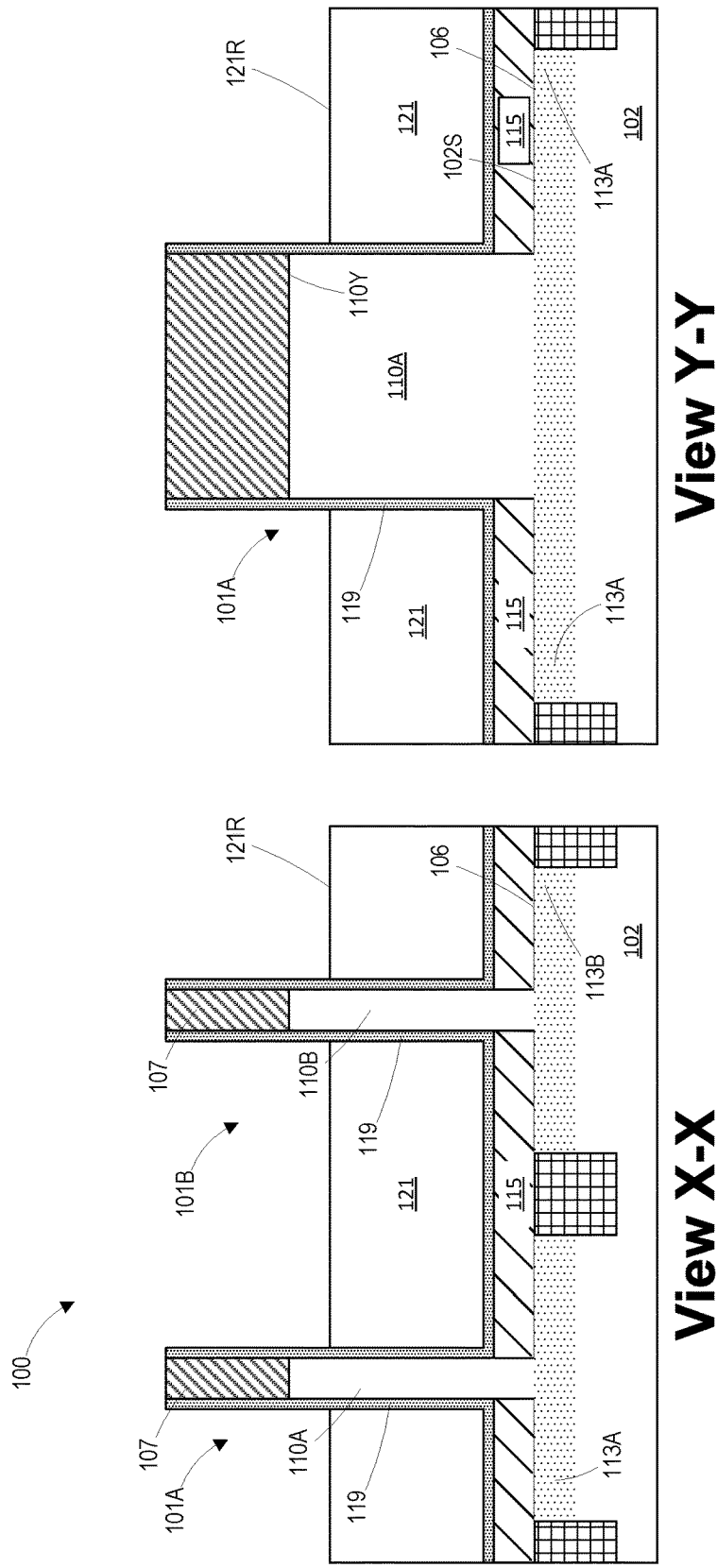

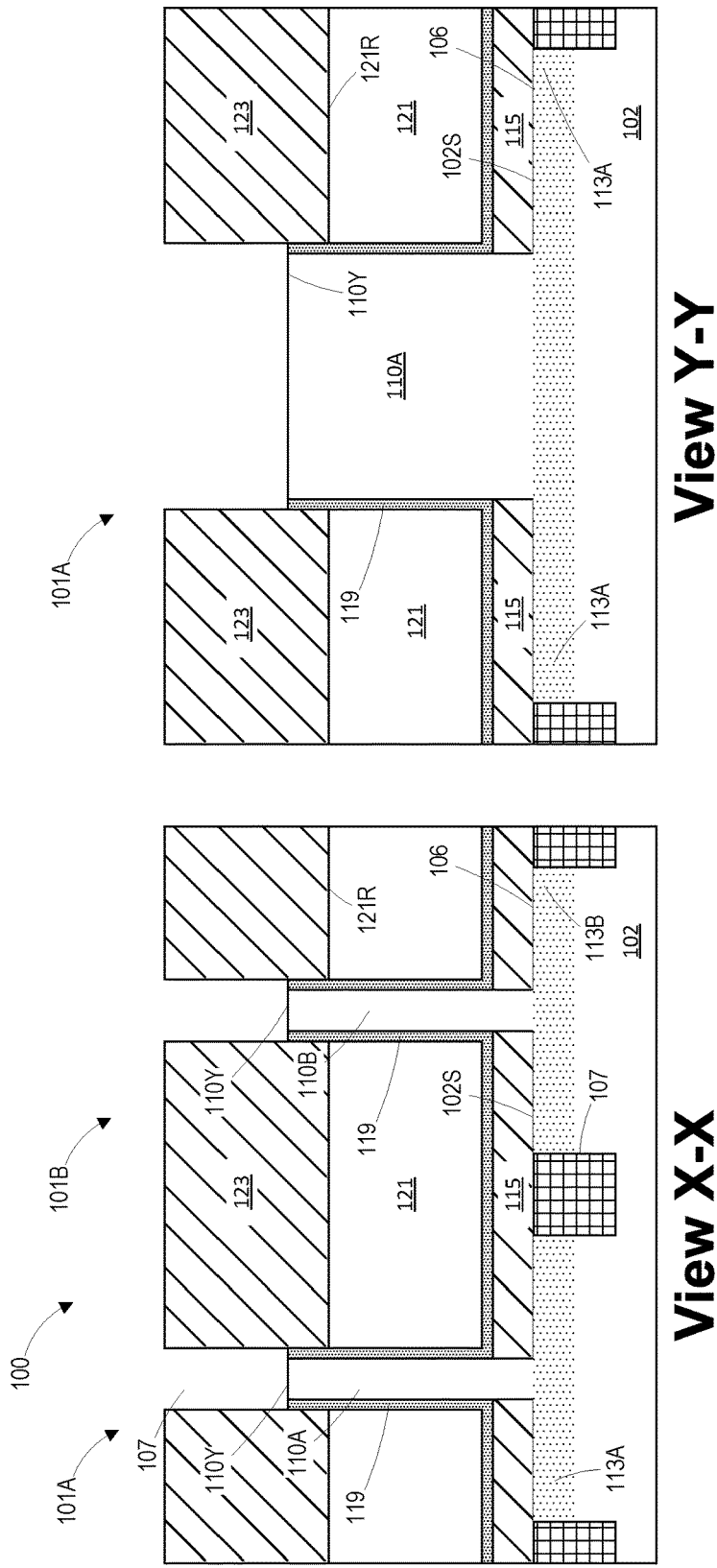

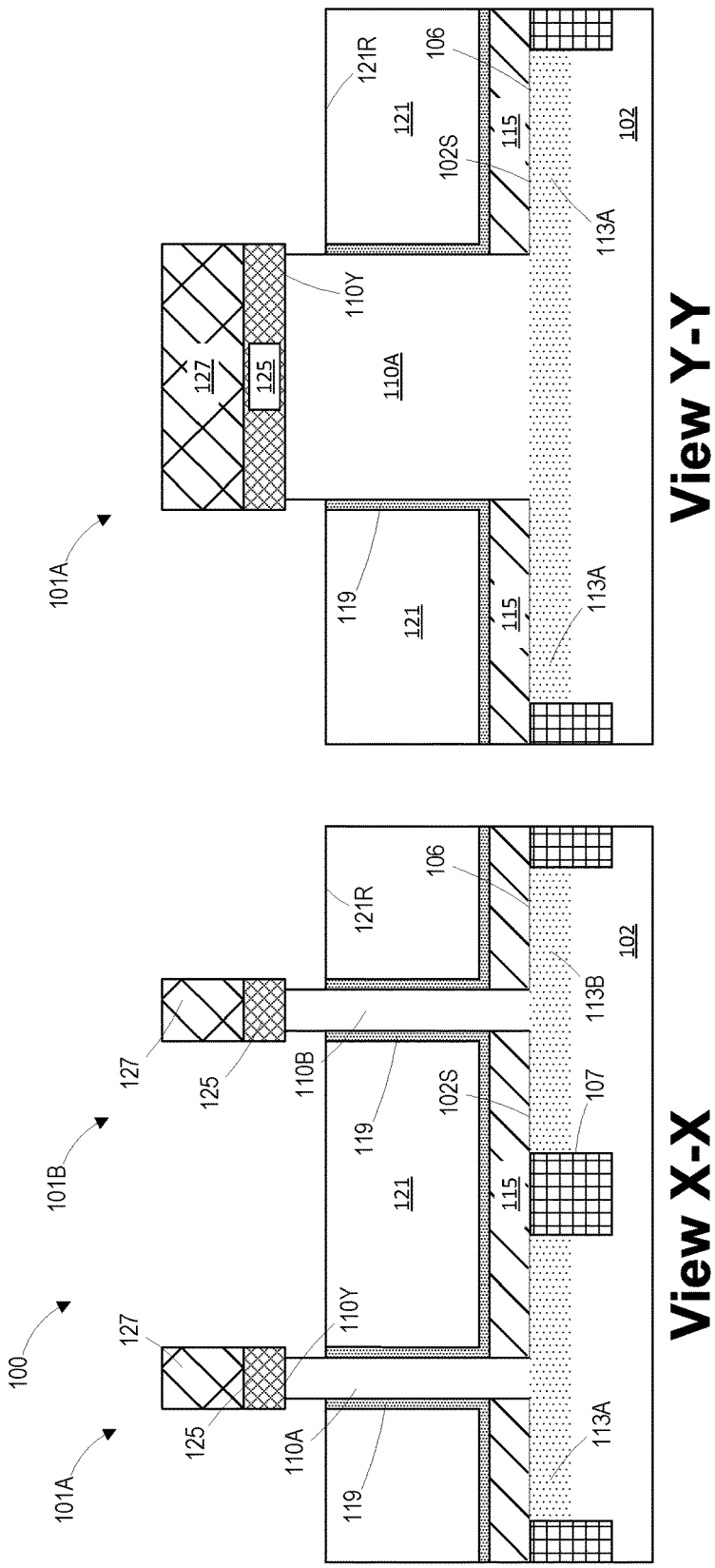

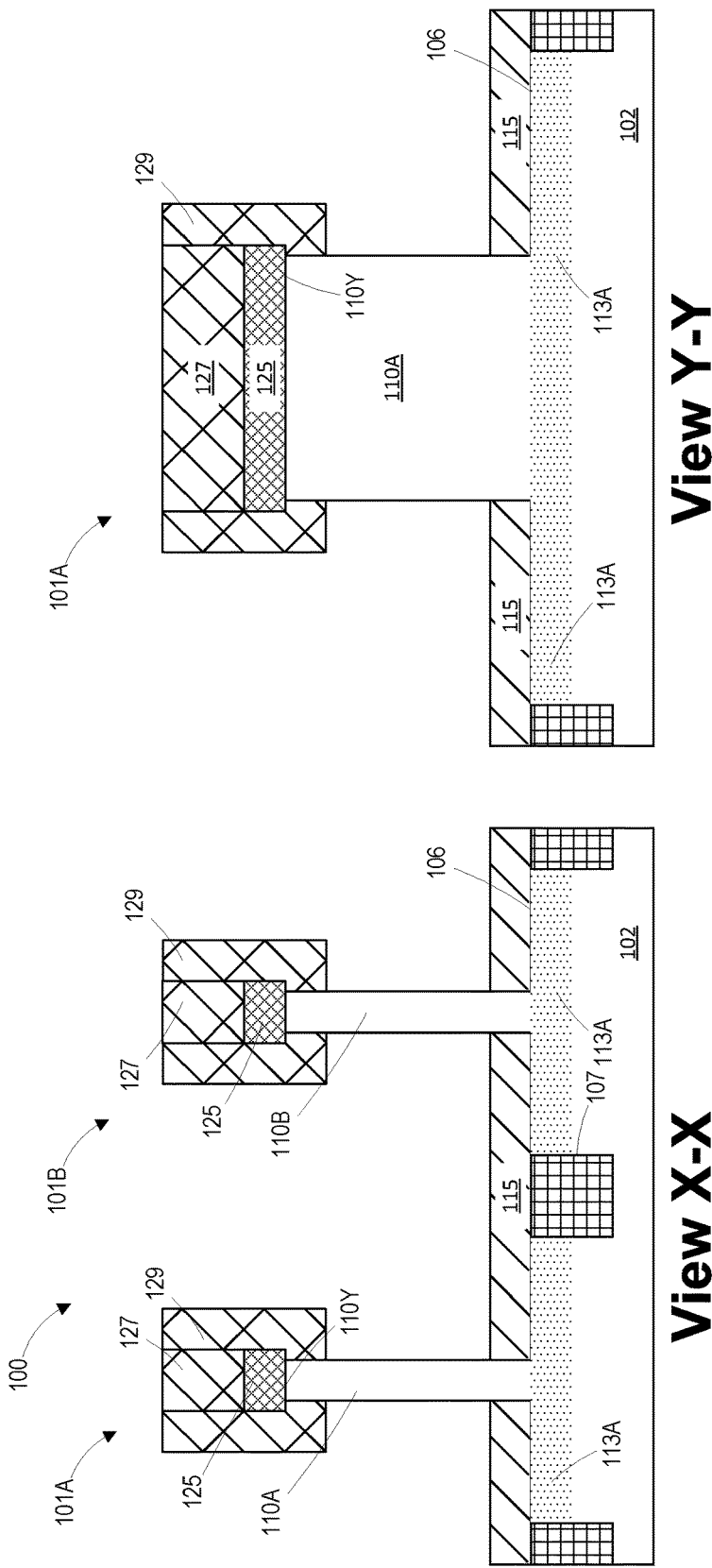

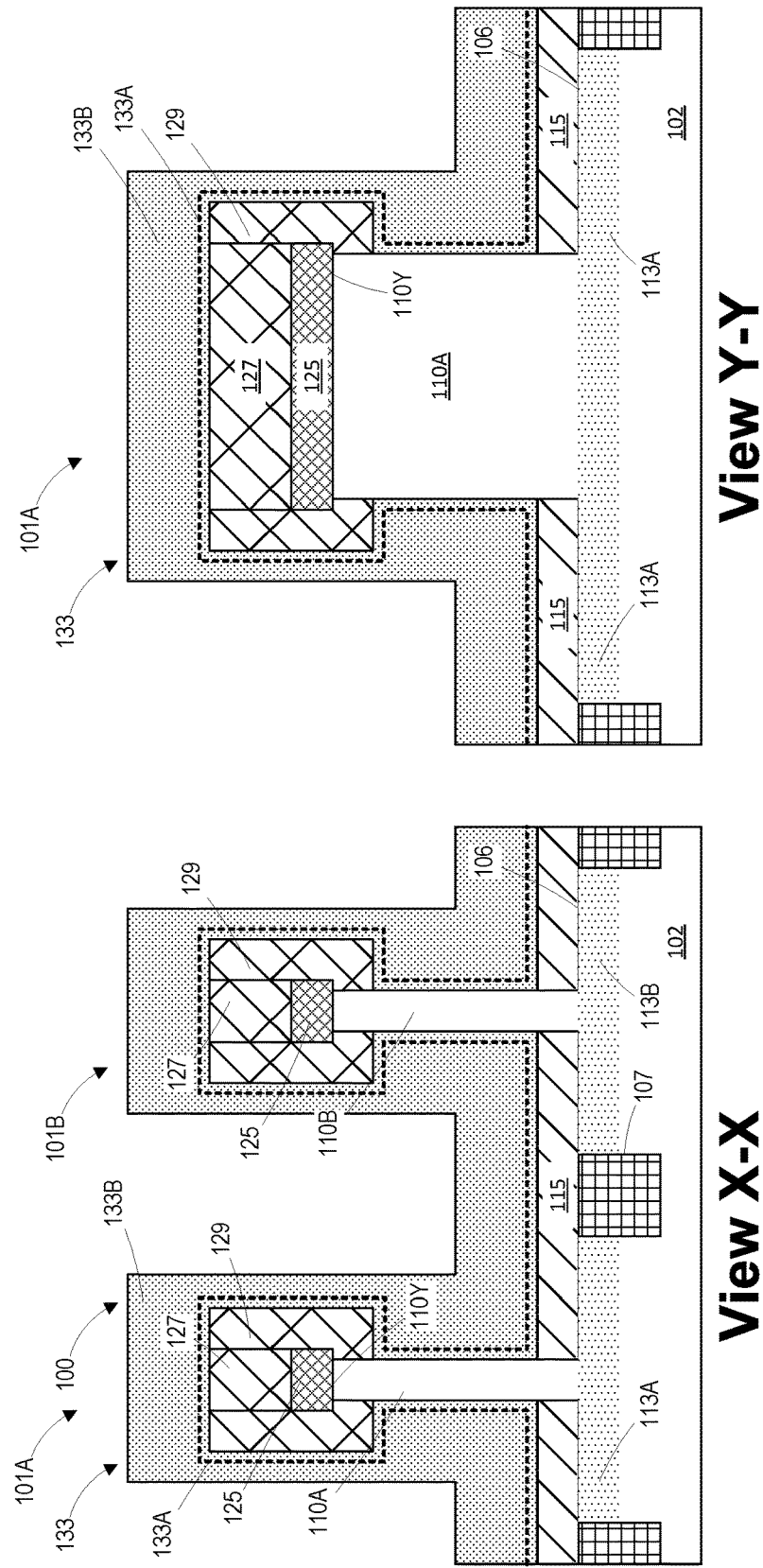

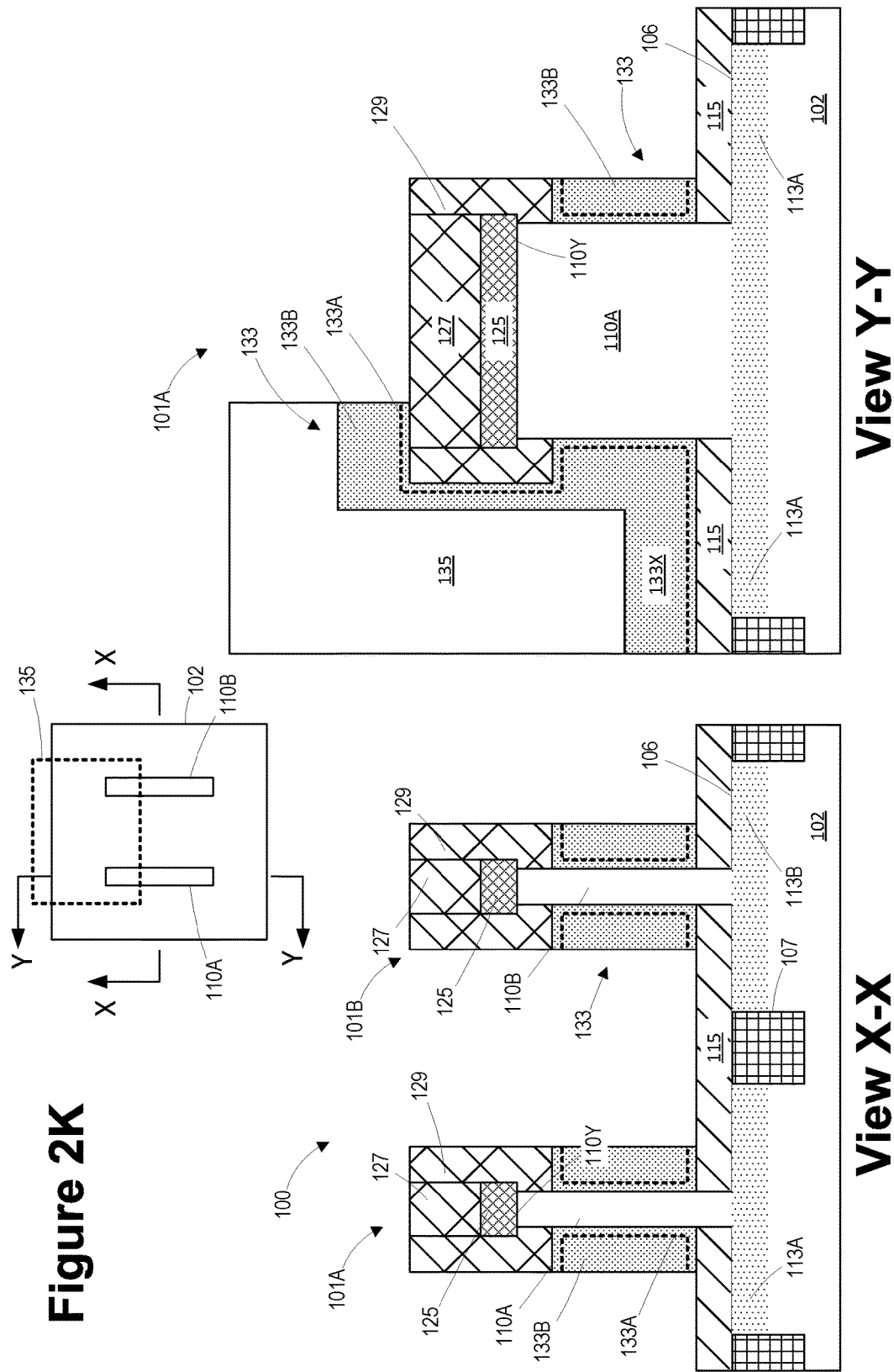

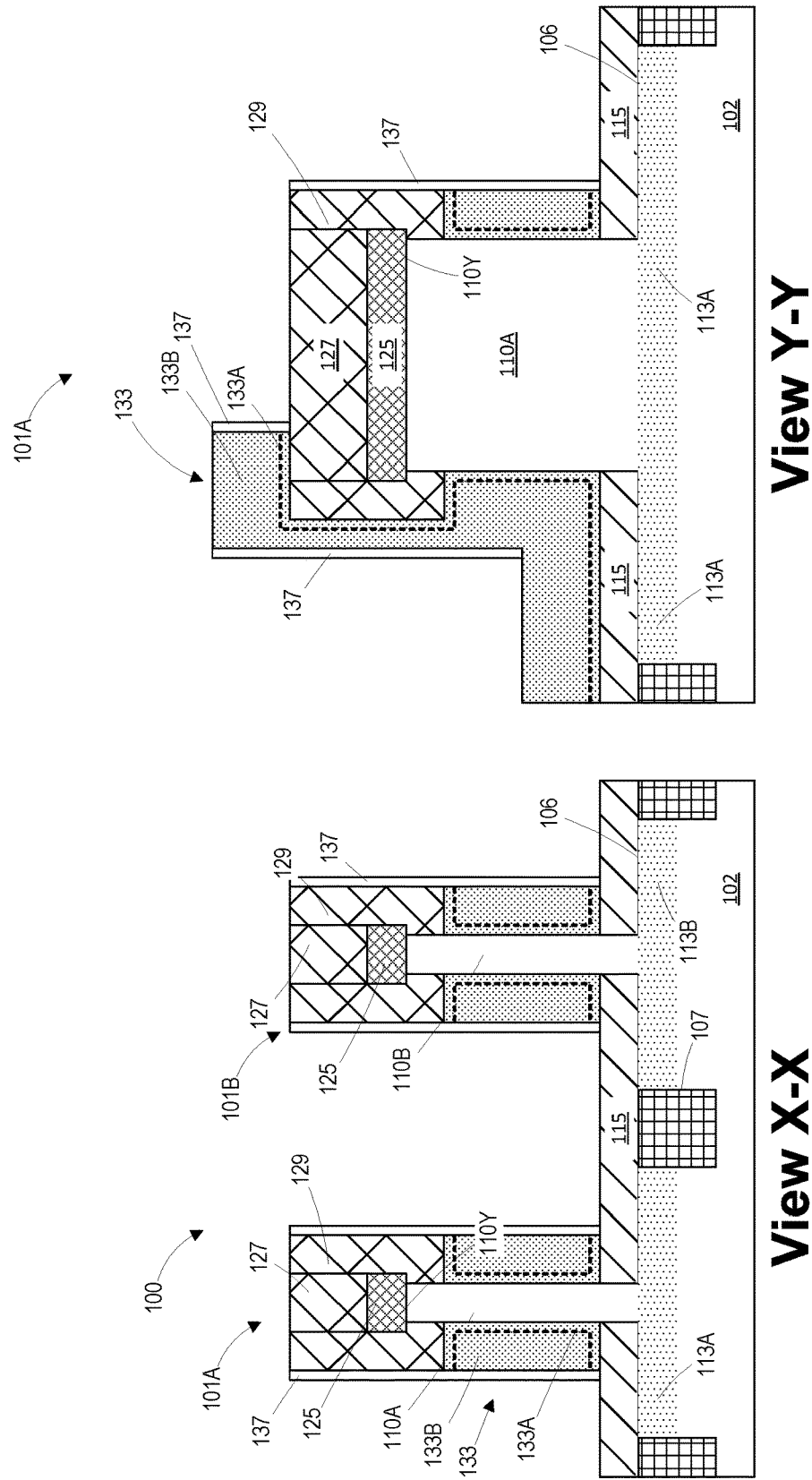

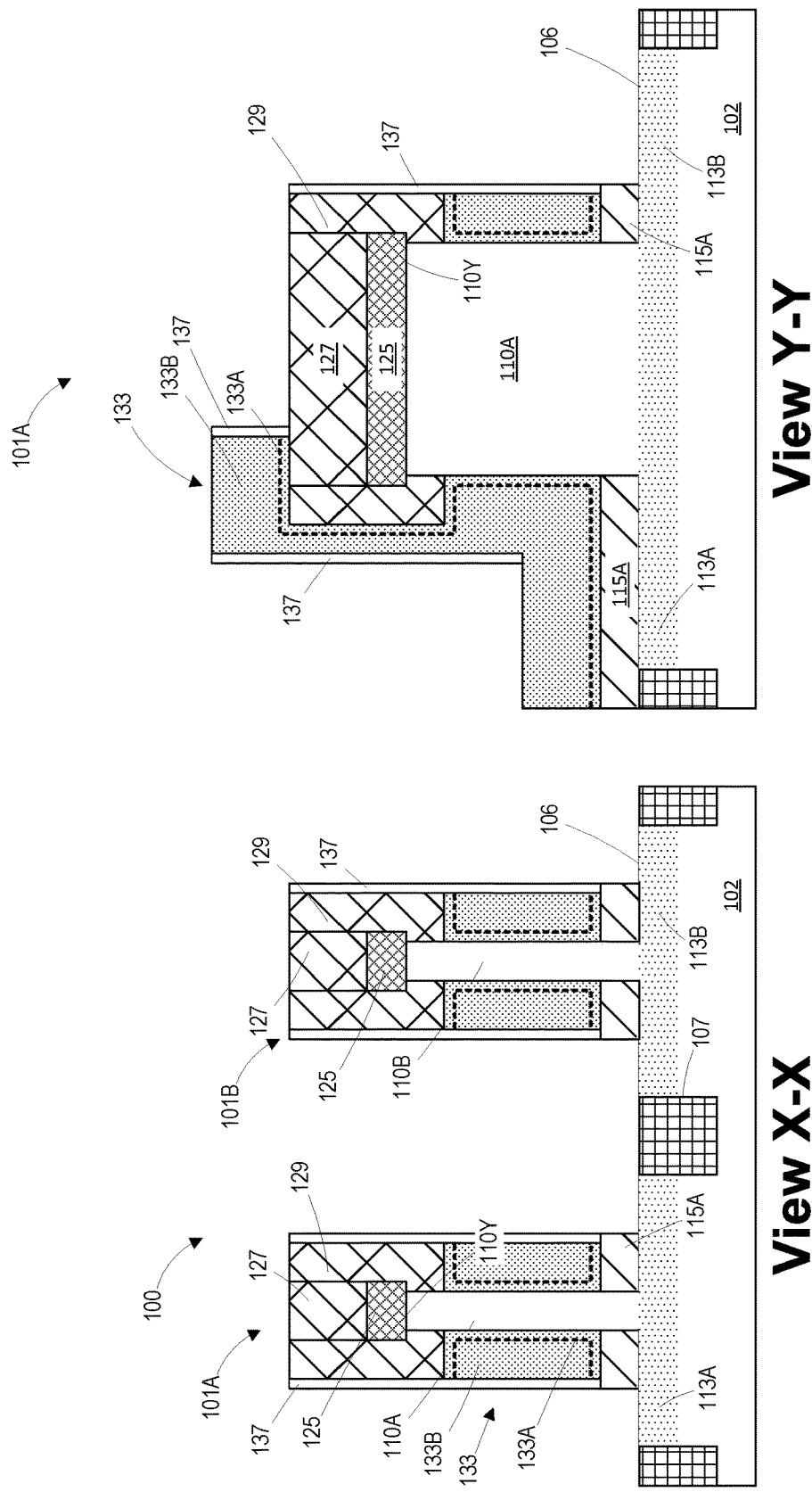

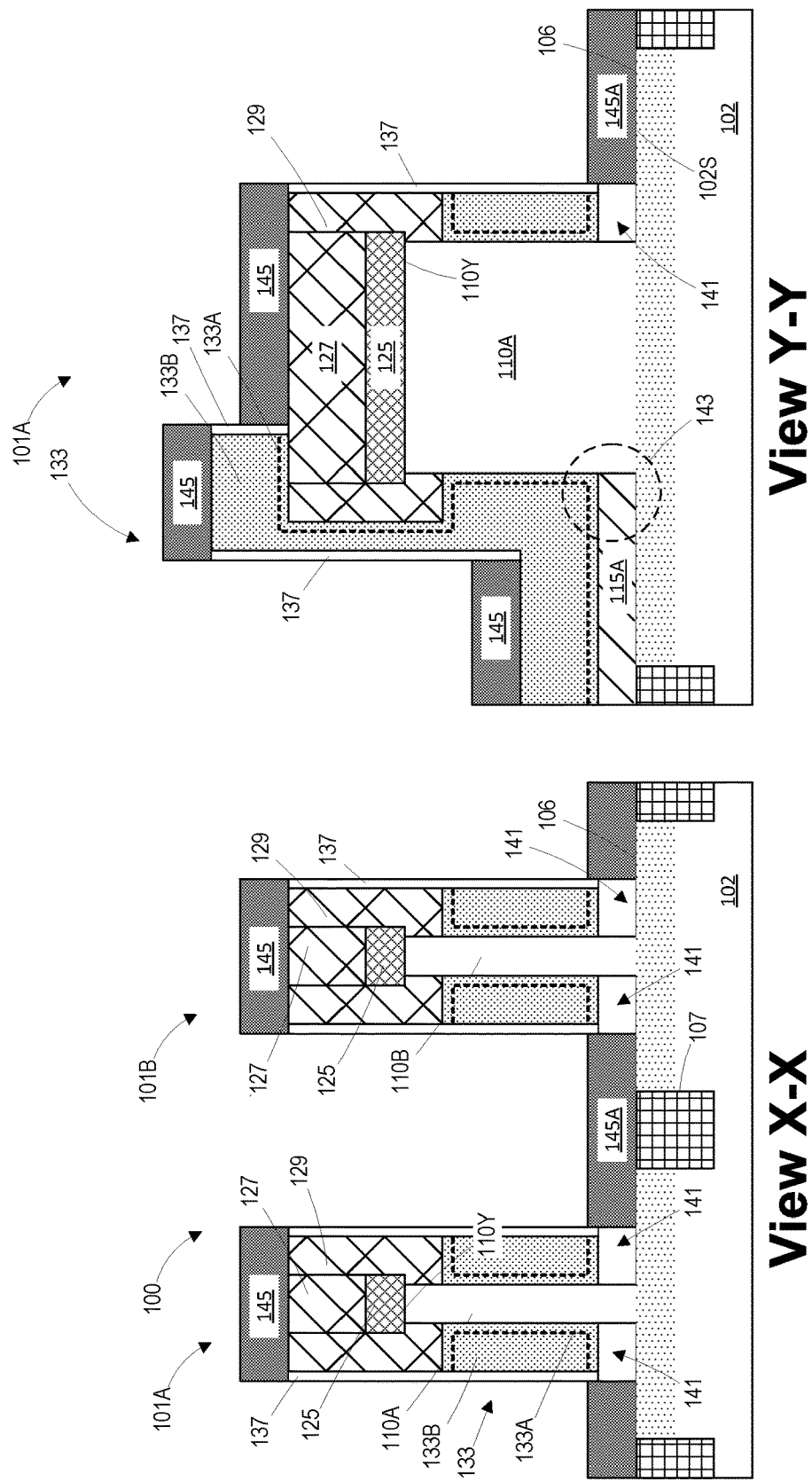

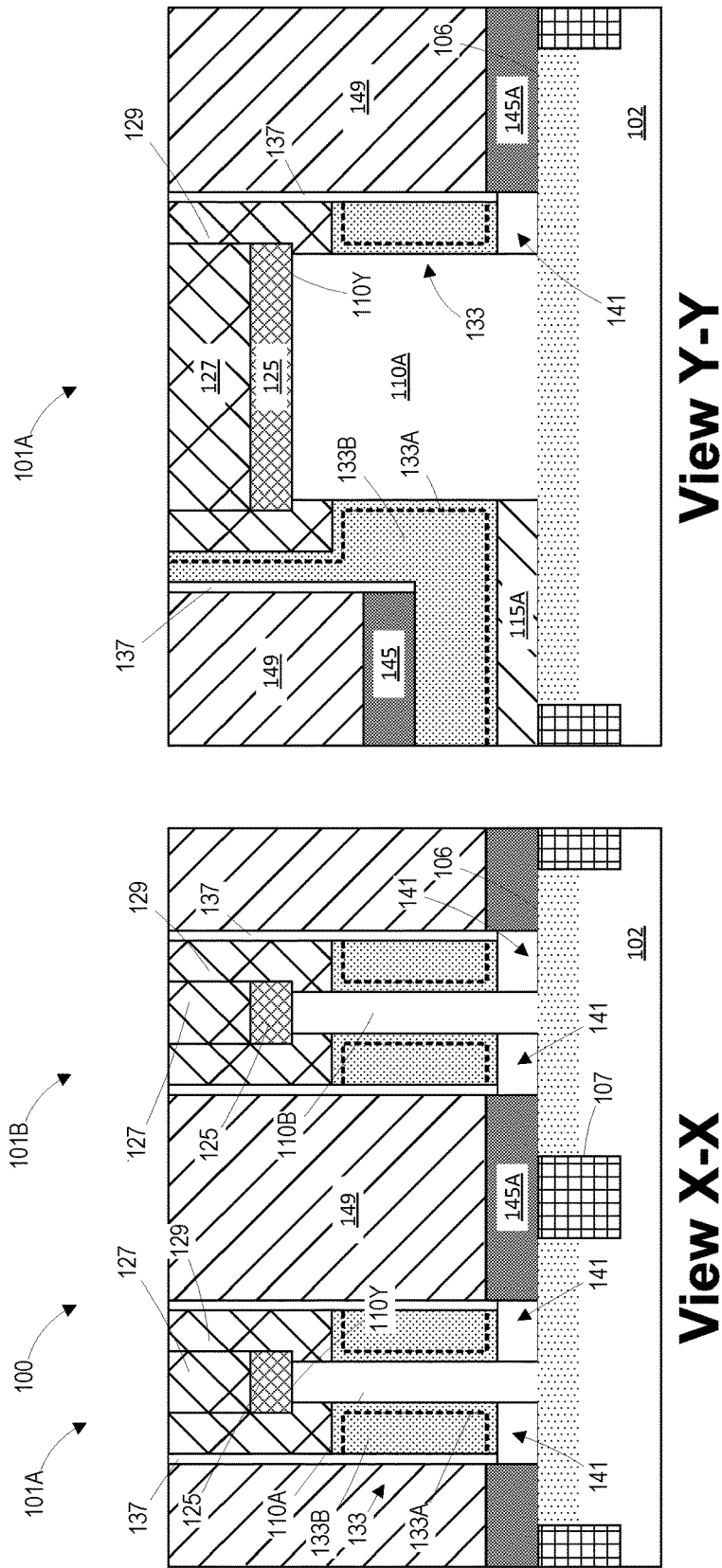

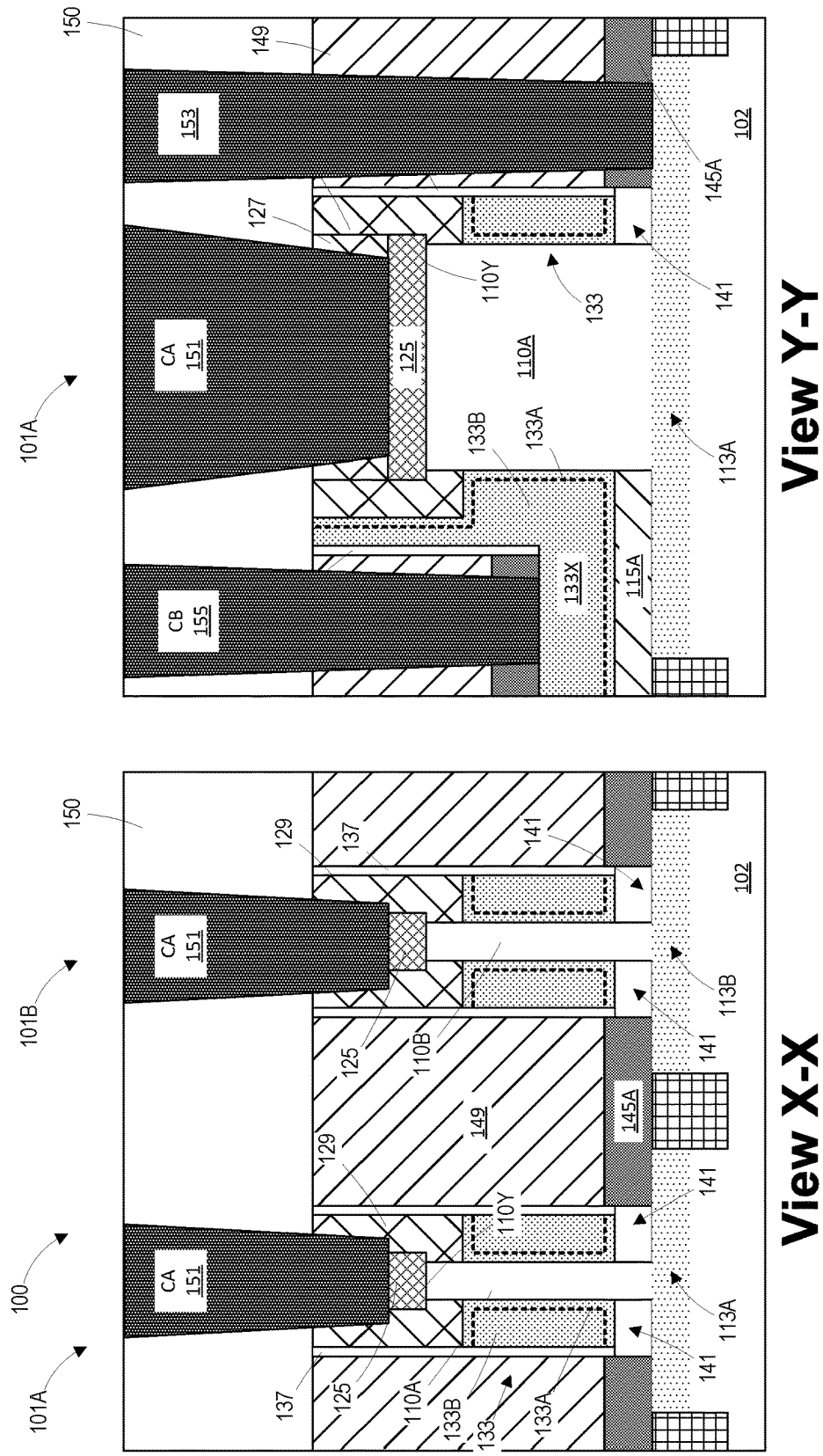

AIR GAP ADJACENT A BOTTOM SOURCE/DRAIN REGION OF VERTICAL TRANSISTOR DEVICE

BACKGROUND OF THE INVENTION

1. Field of the Invention

Generally, the present disclosure relates to the manufacture of semiconductor devices, and, more specifically, to various novel methods of forming an air gap adjacent a bottom source/drain region of a vertical transistor device and the resulting device.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, vertical transistors, etc. The transistors are typically either NMOS (NFET) or PMOS (PFET) type devices wherein the "N" and "P" designation is based upon the type of dopants used to create the source/drain regions of the devices. CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned between the source/drain regions. Upon application of an appropriate control voltage to the gate electrode, a conductive channel region forms between the drain region and the source region.

FIG. 1 is a simplistic and schematic depiction of an illustrative prior art vertical transistor device 10. In general, the vertical transistor 10 comprises a generally vertically oriented channel semiconductor structure 12A that extends upward from a front surface 12S of a semiconductor substrate 12. As indicated in the right-hand portion of FIG. 1, the semiconductor structure 12A may have a variety of different configurations when viewed from above, e.g., circular, rectangular, square, etc., and it has an outer perimeter 12P. The device 10 further comprises a channel region 13, a gate-all-around (GAA) gate structure 14 that is positioned around the perimeter 12P of the semiconductor structure 12A, a bottom source/drain (S/D) region 16, a top S/D region 18, a bottom spacer 15B, and a top spacer 15T. Also depicted is an illustrative bottom contact 20 that is conductively coupled to the bottom S/D region 16 and a top contact 22 that is conductively coupled to the top S/D region 18. In the depicted example, the gate structure 14 comprises a gate insulation layer 14A and a conductive gate electrode 14B. The materials of construction for the components of the device 10 may vary depending upon the particular application. The gate structure 14 may be manufactured using well-known gate first or replacement gate manufacturing techniques.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time. Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in one or more additional stacked so-called "metallization layers" that are formed above the device level of the product. These metallization layers are typically comprised of layers of insulating material with conductive metal lines or conductive vias formed in the layers of material. The first metallization layer in an integrated circuit product is typically referred to as the "M1" layer (or in some cases the "M0" layer), while the conductive vias that are used to establish electrical connection between the M1 layer and lower level conductive structures (explained more fully below) are typically referred to as "V0" vias.

A plurality of device-level contacts is formed so as to establish electrical connection with the metallization layers and the actual semiconductor device, i.e., the transistor. With respect to the formation of a vertical transistor device, such device level contacts would include the schematically depicted top source/drain contact (CA) 22 that is conductively coupled to the top S/D region 18, the schematically depicted bottom source/drain contact (CA) 20 that is conductively coupled to the bottom source/drain (S/D) region 16 and a gate contact (CB) (not shown) that is conductively coupled to the gate structure 14. The CA contacts and the CB contact are typically a uniform body of metal, e.g., tungsten, and may also include one or more metallic barrier layers (not shown) positioned between the uniform body of metal and a surrounding insulating material. With reference to FIG. 1, the spacers 15B, 15T are typically made of silicon nitride which has a relatively high k value of, e.g., about 7-8. As a result of the physical configuration of the vertical transistor 10, a gate-to-bottom S/D capacitor is defined, wherein the gate electrode 14B functions as one of the conductive plates of the capacitor and the bottom source/drain (S/D) region 16 functions as the other conductive plate of the capacitor and the bottom spacer 15B is positioned between the two conductive plates. This gate-to-bottom S/D capacitor is parasitic in nature in that this capacitor must charge and discharge every time the transistor device 10 is turned on and off, all of which results in delaying the switching speed of the device 10. Device designers have made efforts to reduce the parasitic gate-to-bottom S/D capacitor. For example, some process flows have been developed for forming the spacers 15T, 15B of a material having a lower k value than that of silicon nitride so as to reduce the capacitance.

The present disclosure is directed to various novel methods of forming an air gap adjacent a bottom source/drain region of a vertical transistor device and the resulting device that may avoid, or at least reduce, the effects of one or more of the problems identified above

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming an air gap adjacent a bottom source/drain region of a vertical transistor device and the resulting device. One illustrative method disclosed herein includes, among other things, forming an initial bottom spacer above a semiconductor substrate and adjacent a vertically-oriented channel semiconductor structure and forming a gate structure around the vertically-oriented channel semiconductor structure and above the initial bottom spacer. In this example, the method also includes performing at least one etching process to remove at least a portion of the initial bottom spacer that is positioned vertically under the gate structure so as to thereby result in the formation of an air gap that is positioned under the gate structure, wherein the air gap extends around at least a majority of a perimeter of the vertically-oriented channel semiconductor structure, and forming a replacement bottom spacer above the semiconductor substrate and adjacent the air gap.

One illustrative vertical transistor device disclosed herein includes, among other things, a vertically-oriented channel semiconductor structure positioned above a semiconductor substrate and a first bottom spacer positioned above the semiconductor substrate and adjacent the vertically-oriented channel semiconductor structure, wherein the first spacer extends around less than an entirety of a perimeter of the vertically-oriented channel semiconductor structure. In this example, the device includes a gate structure positioned around the vertically-oriented channel semiconductor structure, wherein only a portion of the gate structure is positioned vertically above the first bottom spacer so as to thereby define an air gap that is positioned under the gate structure, wherein the air gap extends around at least a majority of a perimeter of the vertically-oriented channel semiconductor structure and a second bottom spacer positioned above the semiconductor substrate, wherein an upper portion of the second bottom spacer contacts a material formed around the vertically-oriented channel semiconductor structure so as to seal the air gap, wherein the second bottom spacer has a vertical thickness that is greater than a vertical thickness of the air gap.

BRIEF DESCRIPTION OF THE DRAWINGS

The disclosure may be understood by reference to the following description taken in conjunction with the accompanying drawings, in which like reference numerals identify like elements, and in which.

Figure 1:
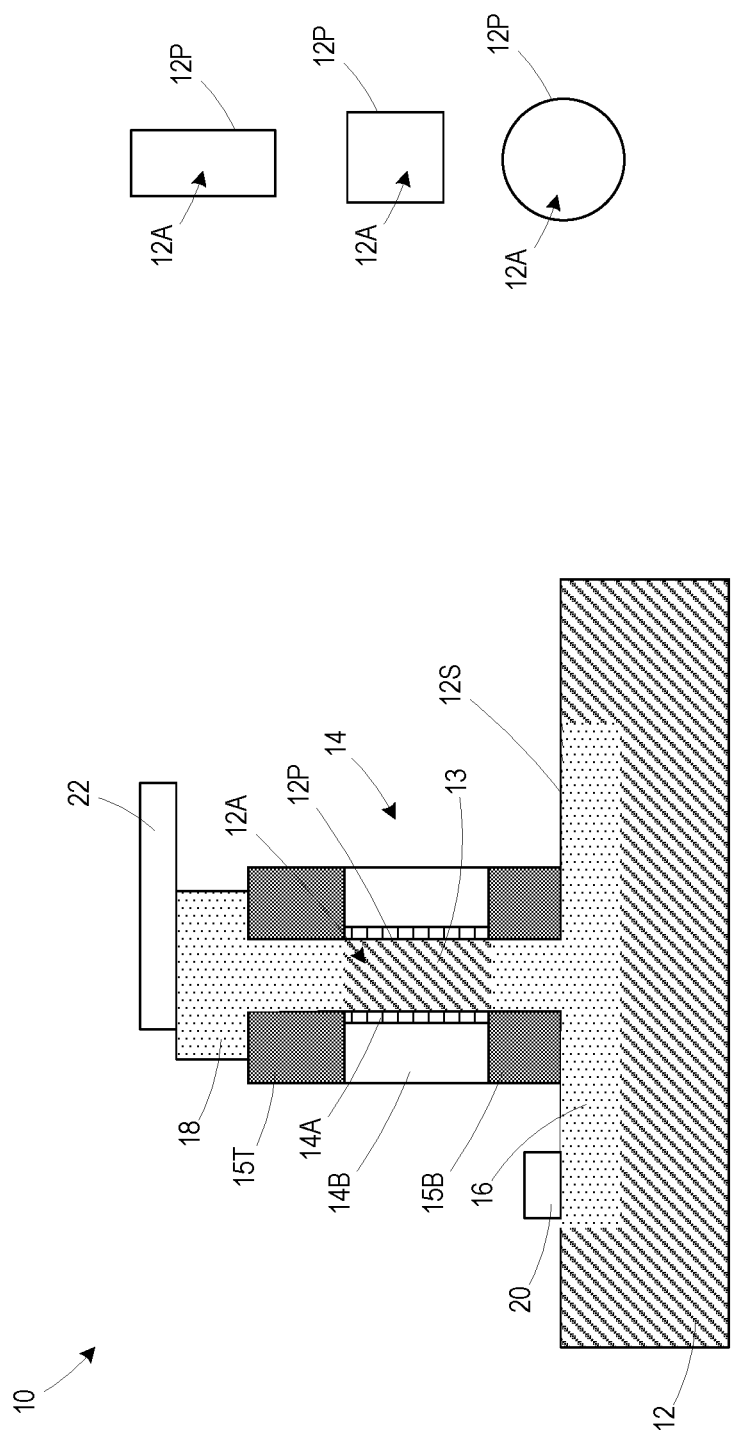
FIG. 1 simplistically depicts an illustrative prior art vertical transistor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification.

It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. To the extent the term "adjacent" is used herein and in the attached claims to described a positional relationship between two components or structures, that term should be understood and construed so as to cover situations where there is actual physical contact between the two components and to cover situations where such components are positioned near one another but there is no physical contact between the two components. Physical contact between two components will be specified within the specification and claims by use of the phrase "on and in contact with" or other similar language. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., halo implant regions, well regions and the like, are not depicted in the attached drawings. Of course, the inventions disclosed herein should not be considered to be limited to the illustrative examples depicted and described herein. The various components and structures of the vertical transistor device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
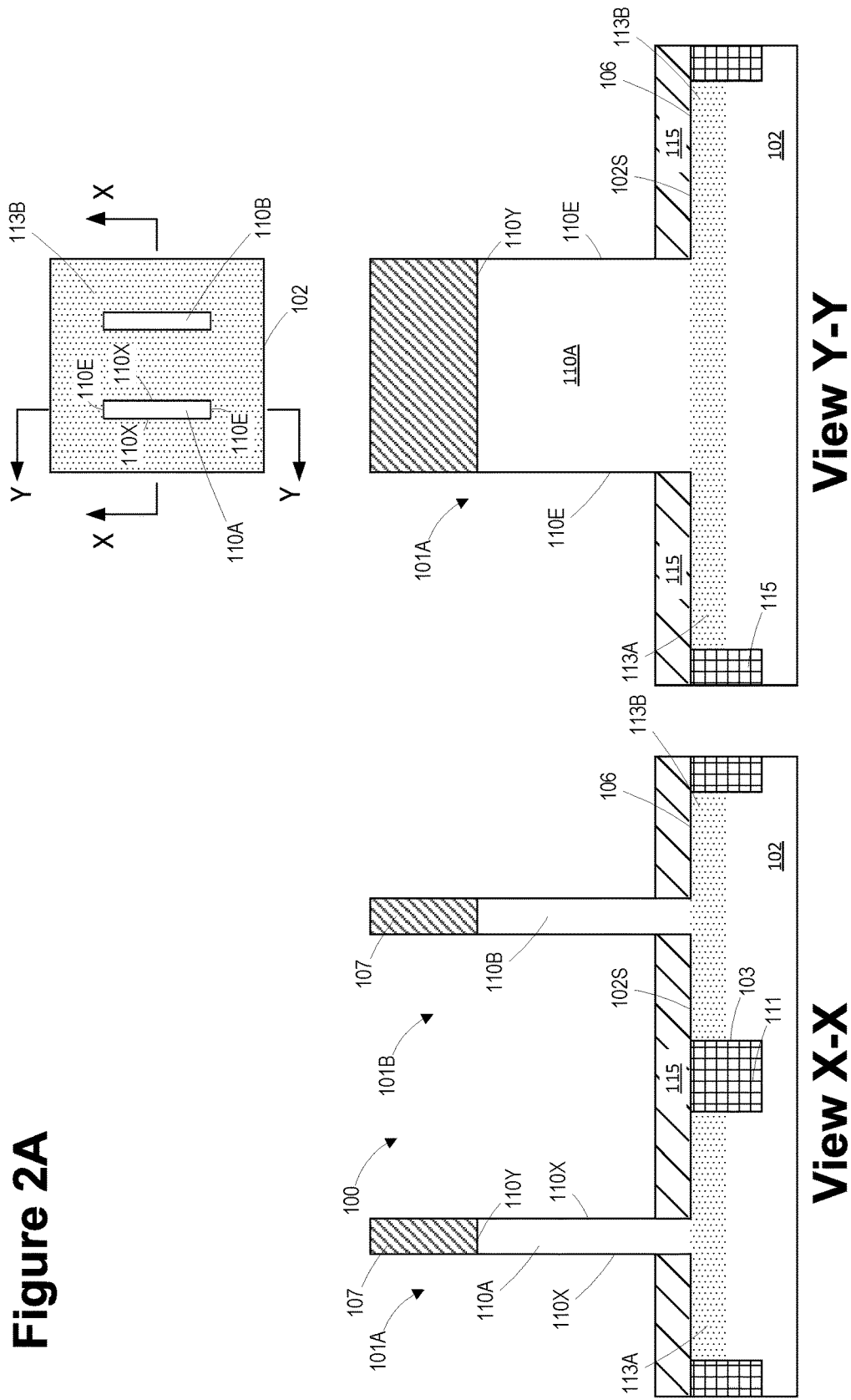
FIGS. 2A-2Q depict various illustrative novel methods disclosed herein for forming an air gap adjacent a bottom source/drain region of a vertical transistor device and the resulting device.

FIGS. 2A-2Q depict multiple illustrative novel methods of forming an air gap adjacent a bottom source/drain region of a vertical transistor device on an integrated circuit (IC)

product 100. In the depicted example, the product includes a plurality of illustrative vertical transistor devices 101A, 101B (which will be collectively referenced using the numeral 101). Each of the vertical transistor devices 101A, 101B includes, respectively, a vertically-oriented channel semiconductor (VOCS) structure 110A, 110B (which will be collectively referred to using the numeral 110). The devices 101A, 101B may be the same type of device, e.g., they both may be N-type devices, or they may be devices of opposite type. Of course, the IC product 100 may typically include millions of such vertical transistor devices 101. In the illustrated examples, the vertical transistor devices 101 have a rectangular cross-section when viewed from above. In other embodiments, the vertical transistor devices 101 may have different cross-section shapes, such as circle, oval, square, etc. (as those shapes similarly depicted in the prior art structure 10 of FIG. 1). Additionally, as shown in FIG. 2A, in the depicted example, the VOCS structures 110 have opposing lateral sidewall surfaces 110X, a top surface 110Y and opposing end surfaces 110E.

FIG. 2A contains a simplistic plan view showing where various cross-sectional views are taken in the drawings. As indicated in the plan view in FIG. 2A, the view X-X is a cross-sectional view taken through both of the VOCS structures 110. The view Y-Y is a cross-sectional view taken through only the VOCS structures 110A (in a direction corresponding to the gate width direction of the vertical transistor device 101A). It should also be noted that, although some of the figures contains a plan view of the product, not all aspects of the processing shown in the cross-sectional views will be depicted in the plan view so as to not overly complicate the drawings.

FIGS. 2A-2Q depict multiple illustrative process flows wherein two illustrative VOCS structures 110 will be formed above a semiconductor substrate 102. The substrate 102 may have a variety of configurations, such as a bulk semiconductor (e.g., silicon) configuration. The substrate 102 may have a bulk configuration (as depicted in FIG. 2A) with an upper surface 102S or a semiconductor-on-insulator or silicon-on-insulator (SOI) configuration (not shown) that includes a bulk semiconductor layer, a buried insulation layer (e.g., silicon dioxide), and an active layer (e.g., silicon), wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. In other applications, the vertically-oriented channel semiconductor structures 110 may be comprised of an alternative semiconductor material, i.e., a semiconductor material other than the semiconductor material of the substrate 102. For example, in the case where the substrate 102 is made of a traditional silicon material, the alternative semiconductor material may be a material such as silicon-germanium ($Si_{(1-x)}Ge_{(x)}$), substantially pure germanium (Ge), a III-V compound semiconductor material, etc.

FIG. 2A depicts one illustrative embodiment of the IC product 100 including the vertical transistor devices 101 disclosed herein at a stage of fabrication after several process operations have already been performed. First, the VOCS structures 110 were formed by performing one or more etching processes through a patterned etch mask 107 so as to define a plurality of trenches 106 in the substrate 102. In some embodiments, the patterned etch mask 107 may be comprised of one or more layers of material, and it may be formed by forming one or more layers of material and thereafter patterning those materials using known photolithography and etching techniques. In one illustrative embodiment, the patterned etch mask 107 may be a dual-layer etch mask that is comprised of a layer of silicon dioxide (not separately shown) that is formed on the VOCS structures 110 and a layer of silicon nitride (not separately shown) that is formed on the layer of silicon dioxide. Then, an etching process was performed through another patterned etch mask (not shown) to define an isolation trench 103 in the substrate between the VOCS structures 110. A layer of insulating material, such as silicon dioxide, was then deposited so as to over-fill the trenches 106 and 103 such that insulating material is positioned above the upper surface of the patterned etch mask 107. Thereafter, a CMP process was performed to planarize the upper surface of the deposited layer of insulating material with the upper surface of the patterned etch mask 107. At that point, a recess etching process was performed to recess the layer of insulating material such that the insulating material is approximately level with the bottom of the trenches 106 while portions of the insulating material remain positioned in the isolation trench 103 defined in the substrate so as to thereby define the isolation structure 111.

Next, in one illustrative embodiment, one or more ion implantation processes (or epi deposition processes) were performed to form bottom source/drain (S/D) regions 113A, 113B (generally referred to with the reference numeral 113) for the devices 101A, 101B, respectively, in the substrate 102. As noted above, the devices 101A, 101B may be the same type of device, e.g., they both may be N-type devices, or they may be devices of opposite type, as in a CMOS application. If the devices 101 are opposite-type devices, then two separate implantation processes would be performed through different patterned implantation masks (not shown). However, for purposes of simplicity, the bottom source/drain (S/D) regions 113 are shaded the same in the drawings so as to not overly complicate the disclosure of the present invention. The bottom source/drain (S/D) regions 113 may be doped with an appropriate dopant (e.g., N-type or P-type) depending upon the type of device 101 under construction.

With continuing reference to FIG. 2A, an initial bottom spacer 115 (which may sometimes be referred to as a first bottom spacer) for each device 101 was formed in the trenches 106. The initial bottom spacer 115 may be formed to any desired thickness, e.g., 4-15 nm, and it may be formed from any desired insulating material, e.g., silicon nitride, a low-k insulating material (k value of 7 or less), silicon dioxide, etc. In one embodiment, the initial bottom spacer 115 may be formed by performing a deposition process so as to over-fill the trenches 106 with insulating material. Thereafter, the upper surface of the layer of insulating material may be planarized by performing, for example, a CMP process, that stops on the patterned etch mask 107. Then, a timed selective recess etching process was performed to recess the layer of insulating material to a desired residual thickness, thereby forming the initial bottom spacer 115. In another embodiment, the initial bottom spacer 115 may be formed by performing a directional deposition process, such as a gas cluster ion beam (GCIB) process or an HDP deposition process, to form the material of the initial bottom spacer 115 substantially on only the horizontally oriented surfaces of the product 100, i.e., in the bottom of the trenches 106 and on the upper surfaces of the patterned etch mask 107, which is not shown in the depicted example as the formation of the material 115 on the upper surface of the patterned etch mask 107 is not required for purposes of the presently disclosed inventions.

Figure 2B:
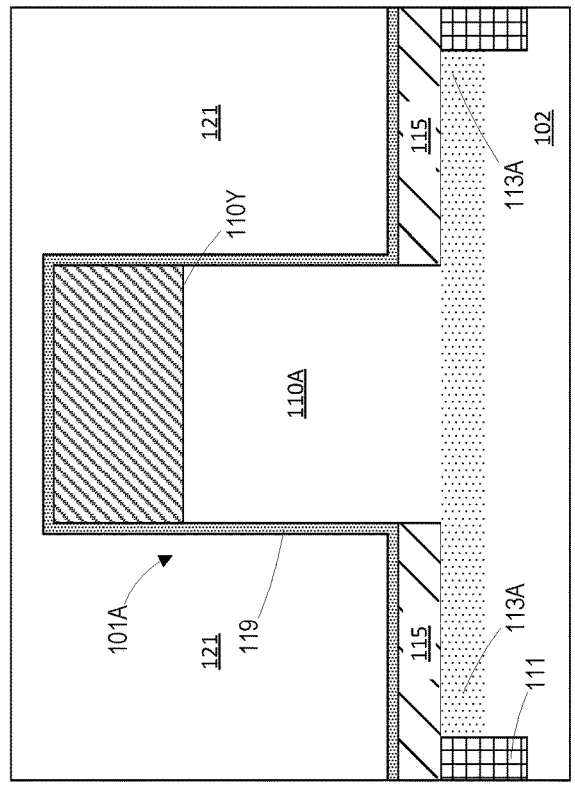
Figure 2B:
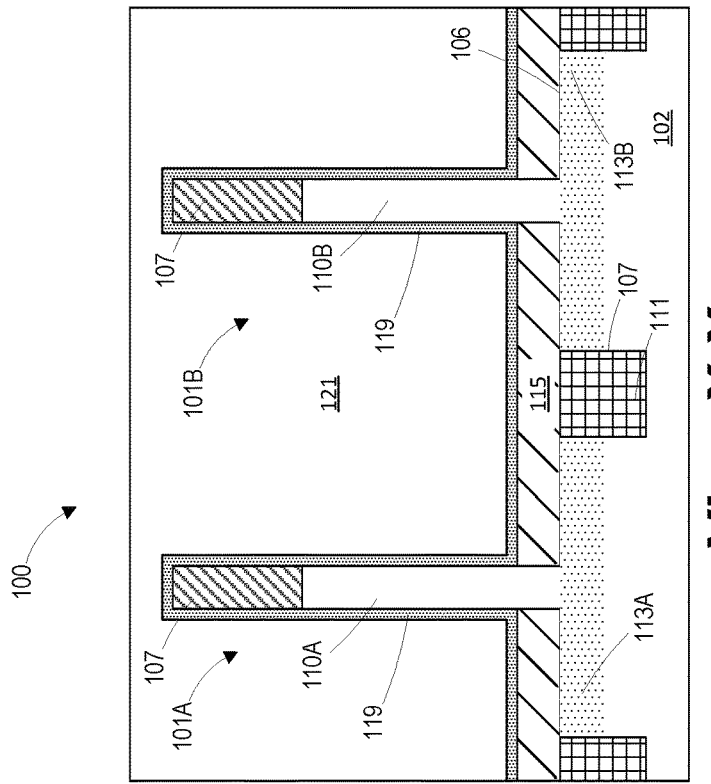

In the example depicted herein, the novel methods and devices will be described in the context where a replacement gate manufacturing technique was performed to form the gate structures for the product 100. Accordingly, FIG. 2B depicts the product 100 after several process operations were performed. First, a conformal deposition process, e.g., an ALD process, was performed to form a relatively thin (e.g., 2-5 nm) sacrificial liner layer 119 on the product 100. The sacrificial liner layer 119 may be comprised of any desired material, but it should be made of a material that exhibits good etch selectivity relative to the material of the initial bottom spacer 115, the patterned etch mask 107 and the VOCS structures 110. In one illustrative example where the initial bottom spacer 115 and the patterned etch mask 107 are comprised of silicon nitride, the sacrificial liner layer 119 may be comprised of silicon dioxide. Next, a sacrificial gate material 121, e.g., amorphous silicon, etc., was deposited across the product 100 so as to overfill the trenches 106.

FIG. 2C depicts the product 100 after several process operations were performed. First, a CMP process was performed on the sacrificial gate material 121 that stopped on the upper surface of the patterned etch mask 107. This effectively exposes the upper surfaces of the patterned etch mask 107 by removing portions of the sacrificial liner layer 119. Thereafter, a timed recess etching process was performed to recess the sacrificial gate material 121 (with a recessed upper surface 121R) to a desired residual vertical thickness (which may vary depending upon the application), e.g., the remaining vertical height of the recessed sacrificial gate material 121 may be on the order of about 10-40 nm. The remaining recessed sacrificial gate material 121 covers portions of the VOCS structures 110 that will become channel portions of the devices 101A, 101B.

FIG. 2D depicts the product 100 after several process operations were performed. First, a blanket-deposition process was performed to form a layer of insulating material 123 across the product 100. The layer of insulating material 123 may be comprised of any desired material, e.g., silicon dioxide, with due consideration being given for the material 123 exhibiting the desired etch selectivity relative to one or more of the surrounding materials depending upon the precise process flow used to manufacture the device . Thereafter, a CMP process was performed on the layer of insulating material 123 that stopped on the upper surface of the patterned etch mask 107 and thereby exposed the patterned etch mask 107 for removal. Next, one or more etching processes were performed to remove the patterned etch mask 107 and thereby expose the upper surfaces 110Y of the VOCS structures 110. In the case where the patterned etch mask 107 is comprised of a layer of silicon nitride positioned above a layer of silicon dioxide, the removal of the silicon dioxide portion of the patterned etch mask 107 may also remove portions of the sacrificial liner layer 119 positioned above the upper surfaces 110Y of the VOCS structures 110, as depicted in FIG. 2D.

Figure 2E:
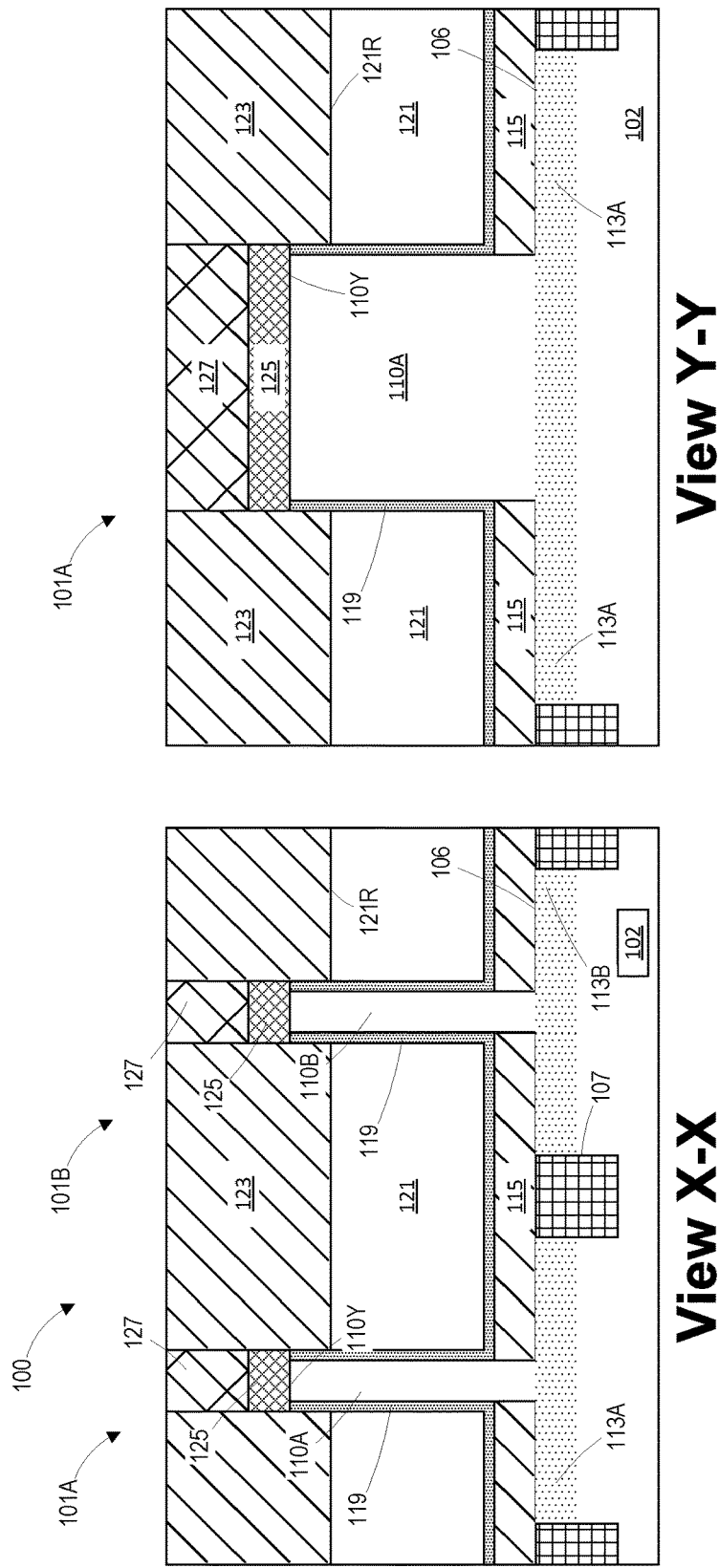

FIG. 2E depicts the product 100 after several process operations were performed. First, an epitaxial growth process was performed to form doped top source/drain (S/D) structures 125 on the devices 101A, 101B, respectively. Next, a blanket-deposition process was performed to form a layer of insulating material 127 across the product 100 so as to overfill the recesses above the top source/drain (S/D) structures 125. The layer of insulating material 127 may be comprised of any desired material, but it should be made of a material that exhibits good etch selectivity relative to the layer of insulating material 123. For example, in the case where the layer of insulating material 123 is comprised of silicon dioxide, the layer of insulating material 127 may be comprised of, e.g., SiCO, SiBCN, etc. Thereafter, a CMP process was performed on the layer of insulating material 127 that stopped on the upper surface of the layer of insulating material 123.

FIG. 2F depicts the product 100 after a selective etching process was performed to remove the layer of insulating material 123 relative to the surrounding materials. This process exposes the sacrificial gate material 121 and a portion of the VOCS structures 110 that extend above the recessed surface 121R of the sacrificial gate material 121.

Figure 2G:
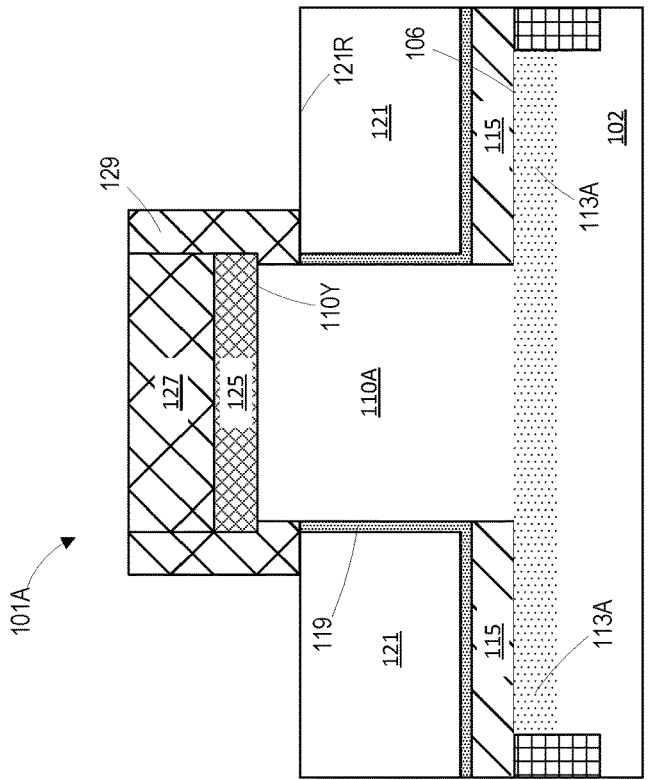
Figure 2G:
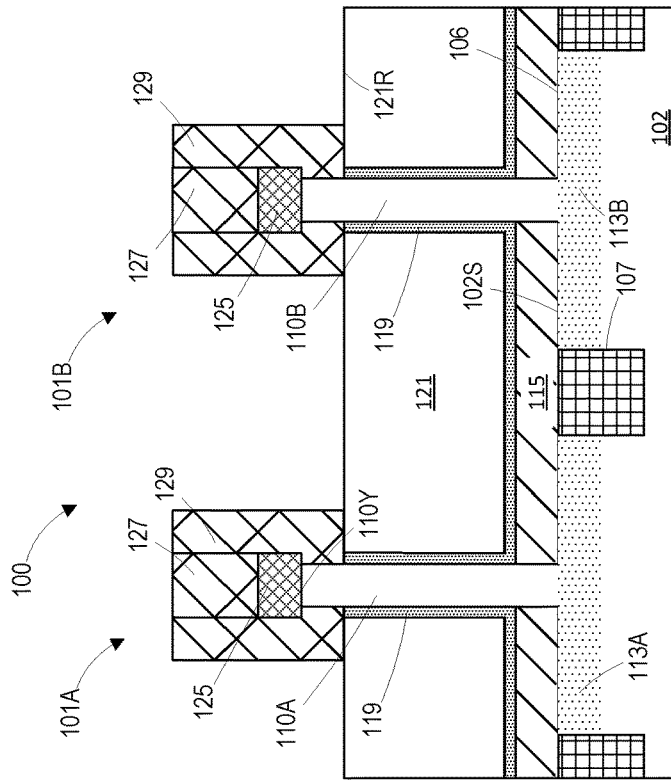

FIG. 2G depicts the product 100 after an insulating spacer 129 was formed adjacent the layer of insulating material 127 and above the recessed sacrificial gate material 121. The spacer 129 may be formed by depositing a conformal layer of spacer material across the product and thereafter performing an anisotropic etching process. The spacer 129 may be comprised of any desired insulating material, e.g., SiCO, SiBCN, etc. In some cases, the spacer 129 may be comprised of the same material as that of the layer of insulating material 127, but that may not be the case in all applications.

Figure 2H:
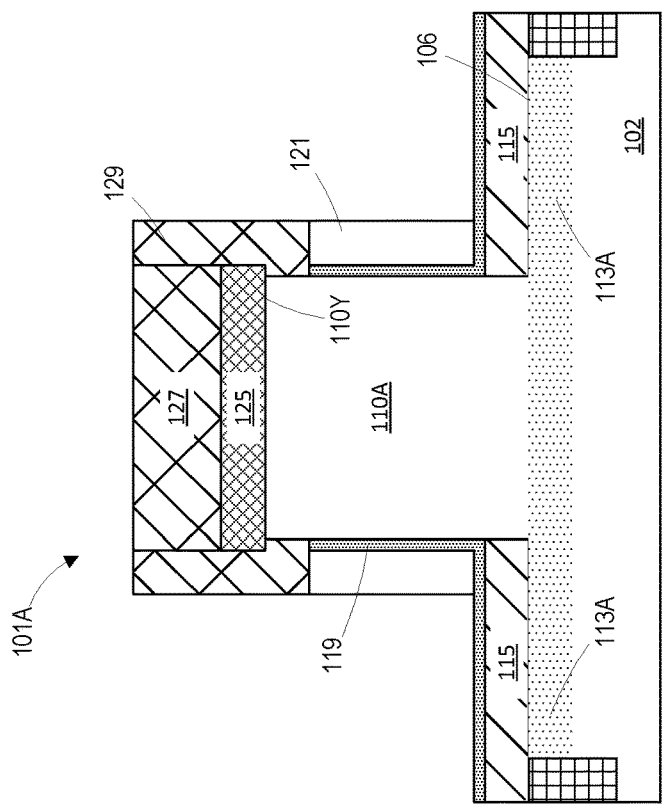
Figure 2H:
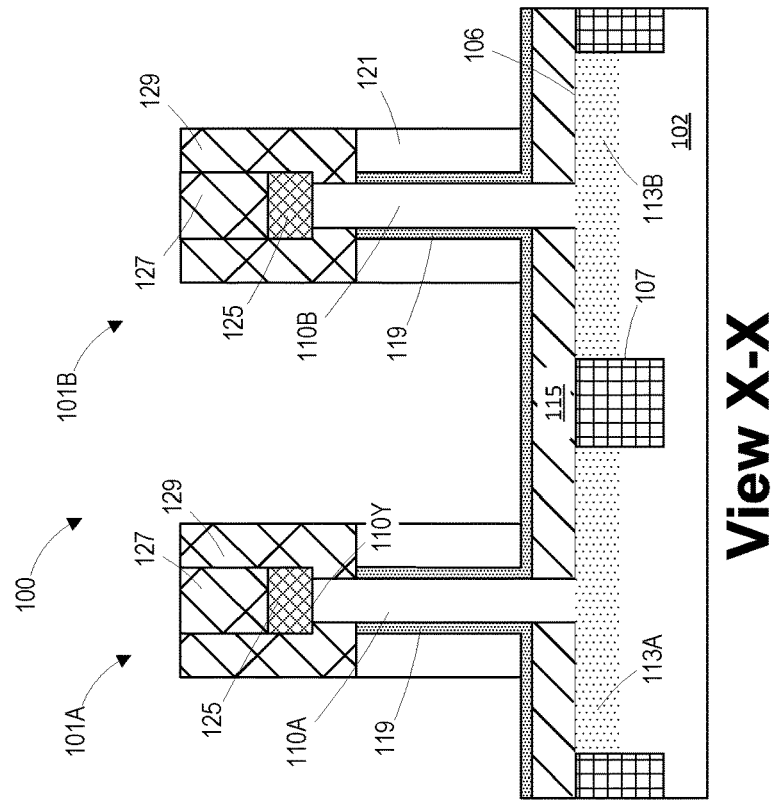

FIG. 2H depicts the product 100 after an anisotropic etching process was performed to remove the exposed portions of the sacrificial gate material 121 selectively relative to the surrounding materials.

FIG. 2I depicts the product after several process operations were performed. First, an isotropic etching process was performed to selectively remove the remaining portions of the sacrificial gate material 121 relative to the surrounding materials. Next, an isotropic etching process was performed to selectively remove the sacrificial liner layer 119 relative to the surrounding materials. This process exposes the portions of the VOC structures 110 between the initial bottom spacer 115 and the insulating spacer 129. In lieu of the processing sequence described in FIGS. 2H-2I, at the point of processing depicted in FIG. 2H, a first isotropic etching process could be performed to remove the sacrificial gate material 121 selectively relative to the surrounding materials followed by performing a second isotropic etching process to remove the sacrificial liner layer 119 selectively relative to the surrounding materials.

FIG. 2J depicts the product 100 after materials for the final gate structures for the devices 101 were formed across the product by performing multiple conformal deposition processes. More specifically, the final gate structures 133 typically include a gate insulation layer 133A (shown as a dashed line), such as silicon dioxide or a high-k (k value greater than 10) insulating material, and one or more layers of conductive material 133B that act as the gate electrode, e.g., a metal, a metal alloy, titanium nitride, tantalum nitride, tungsten, aluminum, polysilicon, etc.

FIG. 2K depicts the product after several process operations were performed. First, a patterned masking layer 135—generally known as a gate contact cut mask—was formed so as to permit patterning the materials 133B, 133A so as to thereby define the final gate structures 133. The patterned masking layer 135 is depicted as a dashed line in the simplistic plan view in FIG. 2K. The patterned masking layer 135 may be made of any desired material, e.g., OPL, and it may be formed using traditional techniques. Thereafter, one or more anisotropic etching processes were performed through the patterned masking layer 135 to remove the exposed portions of the materials 133B, 133A. Note that, in this example, the final gate structures 133 have a shared gate-contact portion 133X that extends laterally away from the VOCS structures 110 to provide a means for landing a gate contact (CB) structure. Of course, if desired, the patterned masking layer 135 could have been configured such that the devices 101A and 101B would have separate gate contact portions to thereby allow individual access to each of the devices 101A, 101B. Also note that, after patterning, the gate structure exposes portions of the initial bottom spacer 115.

FIG. 2L depicts the product after several process operations were performed. First, the patterned masking layer 135 was removed. Then, a relatively thin (e.g., 2-5 nm) protective insulating spacer 137 was formed on the substantially vertically oriented sidewalls of the various structures, e.g., the insulating spacer 129 and the gate structures 133. The purpose of the protective insulating spacer 137 is to protect the materials of the gate structures 133 during a subsequent etching process that is described more fully below. The protective insulating spacer 137 may be formed by depositing a conformal layer of spacer material across the product and thereafter performing an anisotropic etching process. The spacer 137 may be comprised of any desired insulating material, e.g., SiCO, SiBCN, etc. In some cases, the spacer 137 may be comprised of the same material as that of the layer of insulating material 127 and the spacer 129, but that may not be the case in all applications.

FIG. 2M depicts the product after an anisotropic etching process was performed to remove the exposed portions of the initial bottom spacer 115 not covered by the gate structures 133 and the protective insulating spacer 137 relative to the surrounding materials so as to result in the structure depicted in FIG. 2M. This results in a remaining portion 115A of the initial bottom spacer 115 being positioned vertically under the gate structures 133.

Figure 2N:
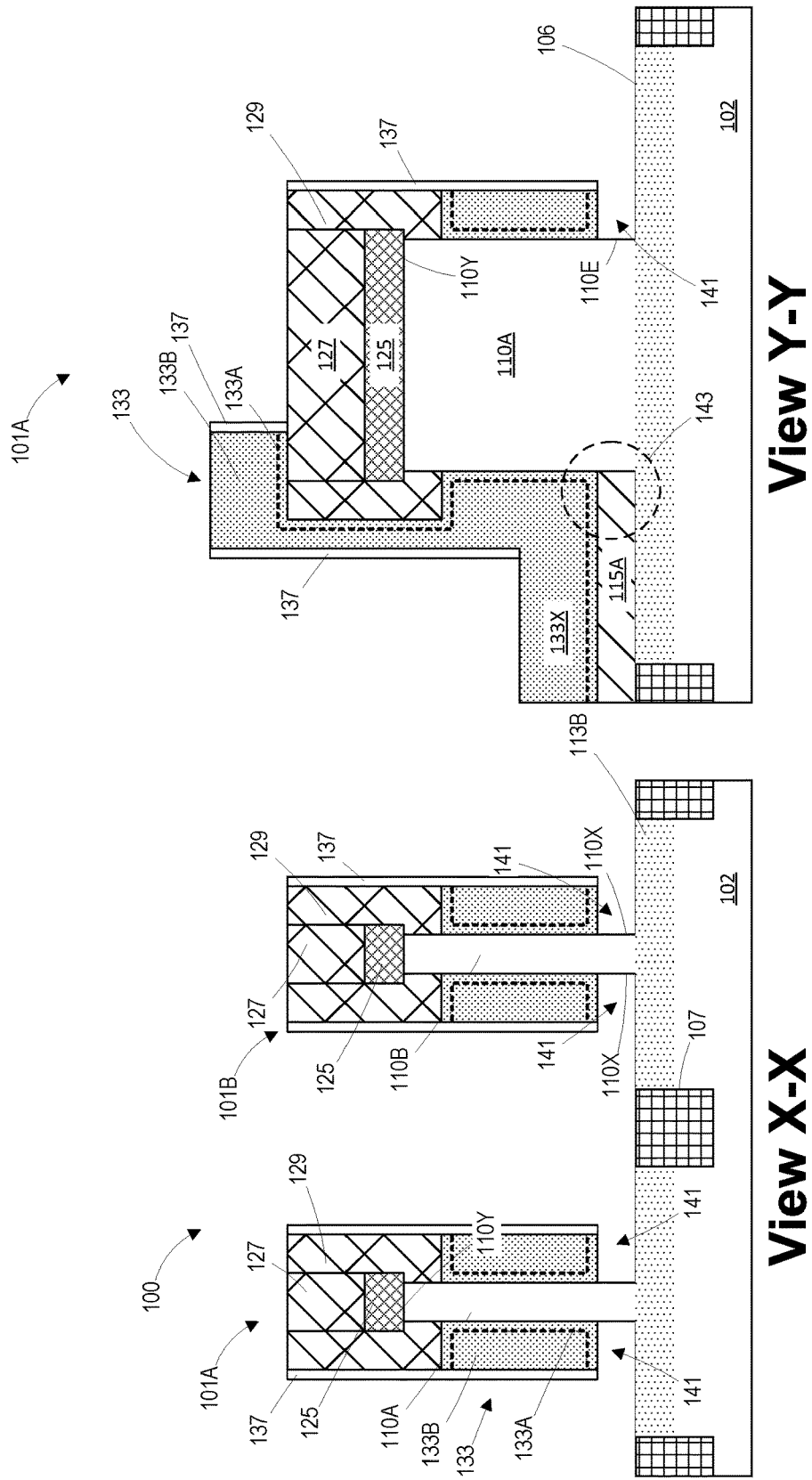

FIG. 2N depicts the product after an isotropic etching process was performed to remove at least some of the remaining portion 115A of the initial bottom spacer 115 selectively relative to the surrounding materials. This process operation results in the formation of an air gap 141 around at least a majority, and in some cases a substantial portion (e.g., up to at least about 80%), of an outer perimeter of the VOCS structures 110 and under portions of the final gate structures 133. In the depicted example, a continuous air gap 141 is formed that is located adjacent substantially the entire axial length of both of the opposing lateral sidewalls 110X and one of the end surfaces 110X of the VOCS structures 110. Note that, in the depicted example, remaining portion 115A of the initial bottom spacer 115 remains positioned under the gate-contact portion 133X of the final gate structures 133 and, more particularly, adjacent an end surface 110E of the VOCS structures 110 as indicated in the dashed-line region 143. However, if desired, in some applications, the etching process may be performed for a sufficient duration to remove substantially all of the remaining portion 115A of the initial bottom spacer 115 from beneath the gate-contact portion 133X. In such a situation, the resulting air gap 141 would extend around the entire perimeter of the VOCS structures 110, i.e., the air gap 141 would be positioned adjacent both of the sidewalls 110X and both of the end surfaces 110E of the VOCS structures 110.

FIG. 2O depicts the product 100 after an insulating material 145 was formed on the substantially horizontally oriented surfaces of the product. The portions of the insulating material 145 positioned in the trenches 106 adjacent the air gaps 141 constitute a replacement bottom spacer 145A for the devices (which may sometimes be referred to as a second bottom spacer). The insulating material 145 may be comprised of a variety of different materials, e.g., silicon nitride, and it should be formed to a vertical thickness that is greater than the vertical thickness of the air gap 141 and the vertical thickness of the remaining portion 115A of the initial bottom spacer 115. In one illustrative example, a directional deposition process, such as a gas cluster ion beam (GCM) process, may be performed to form the insulating material 145. In general, the directional deposition process results in the formation of the material 145 on the substantially horizontally oriented surfaces, such as above the upper surface 102S of the substrate 102 and the upper surfaces of the materials 127/129, without forming appreciable amounts of the material 145 on vertically oriented sidewall surfaces of the various structures. The replacement bottom spacer 145A is formed such that an upper portion of the replacement bottom spacer contacts a material formed around the vertically-oriented channel semiconductor structure 110 so as to seal the air gap 141. For example, the replacement bottom spacer 145 may be formed such that it contacts the gate structure 133 or materials positioned laterally between the gate structure 133 and the replacement bottom spacer 145A (such as the protective insulating spacer 137) so as to effectively seal off the air gap 141. Sealing the air gap 141 prevents subsequently formed materials from entering into the air gap 141. Note that the replacement bottom spacer 145A extends around less than an entirety of the VOCS structures 110. In another illustrative process flow, the insulating material 145 may be formed by performing an HDP nitride deposition followed by performing a brief etching process. In an HDP nitride deposition process, more of the silicon nitride materials are formed on the horizontally oriented surfaces of the various structures than is formed on the vertically-oriented surfaces. This deposition-etch sequence may be repeated several times to insure that, after all of these deposition-etch processes are performed, the deposited material is positioned substantially only on the horizontally oriented surfaces, e.g., the top and bottom, with little to none of the material being positioned on the substantially vertically oriented sidewalls.

FIG. 2P depicts the product 100 after several process operations were performed.

First, a blanket-deposition process was performed to form a layer of insulating material 149 across the product 100 so as to overfill all of the recesses on the product. Thereafter, one or more CMP processes were performed to remove materials positioned above the layer of insulating material 127 and the spacer 129. The layer of insulating material 149 may be comprised of any desired material, e.g., silicon dioxide, but it should be made of a material that exhibits good etch selectivity relative to the layer of insulating material 127 and the spacer 129.

FIG. 2Q depicts the product 100 after two separate top source/drain (CA) contact structures 151, two separate bottom source/drain (CA) contact structures 153 and a common gate contact (CB) structure 155 were formed in a layer of insulating material 150 using traditional manufacturing techniques. The gate contact (CB) structure 155 is conductively coupled to the upper surface of the gate-contact portion 133X of the final gate structures 133. The top source/drain (CA) contact structures 151 are conductively coupled to the epi material 125 on the devices 101. The bottom source/drain (CA) contact structures 153 are conductively coupled to their respective bottom source/drain regions 113A, 113B. The contact structures 151, 153 and 155 may be of any desired cross-sectional configuration when viewed from above, e.g., square, rectangular, round, etc. The contact structures 151, 153 and 155 are intended to be schematic and representative in nature, as they may be formed using any of a variety of different conductive materials and by performing traditional manufacturing operations. The contact structures 151, 153 and 155 may also contain one or more barrier layers (not depicted). In one illustrative example, the contact structures 151, 153 and 155 may be formed by forming contact openings in the various insulating material layers to expose the desired landing point for the contact, and thereafter depositing a liner, e.g., Ti, TiN, in the contact openings. Then, a deposition process may be performed so as to overfill the contact openings with a conductive material, such as tungsten or cobalt. Thereafter, a CMP process may be performed to planarize the upper surface of the layer of insulating material 150, which results in the removal of excess portions of the liner and the tungsten (or cobalt) positioned above the layer of insulating material 150 outside of the contact openings and the formation of the contact structures 151, 153 and 155.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a vertical transistor, comprising:
   forming an initial bottom spacer above a semiconductor substrate and adjacent a vertically-oriented channel semiconductor structure;
   forming a gate structure around said vertically-oriented channel semiconductor structure and above said initial bottom spacer;
   performing at least one etching process to remove at least a portion of said initial bottom spacer that is positioned vertically under said gate structure so as to thereby result in the formation of an air gap that is positioned under said gate structure, wherein said air gap extends around at least a majority of a perimeter of said vertically-oriented channel semiconductor structure; and
   forming a replacement bottom spacer above said semiconductor substrate and adjacent said air gap.

2. The method of claim 1, wherein performing said at least one etching process comprises:
   performing at least one anisotropic etching process so as to remove a portion of said initial bottom spacer that is not covered by said gate structure while leaving a remaining portion of said initial bottom spacer positioned vertically under said gate structure; and
   after performing said at least one anisotropic etching process, performing at least one isotropic etching process to remove at least a portion of said remaining portion of said initial bottom spacer so as to thereby result in the formation of said air gap.

3. The method of claim 1, wherein, after performing said at least one etching process, a remaining portion of said initial bottom spacer remains positioned under a gate contact portion of said gate structure adjacent an end surface of said vertically-oriented channel semiconductor structure.

4. The method of claim 1, wherein performing said at least one etching process to form said air gap results in the formation of an air gap that extends around an entirety of said perimeter of said vertically-oriented channel semiconductor structure.

5. The method of claim 1, wherein said vertically-oriented channel semiconductor structure comprises opposing lateral sidewalls and opposing end walls and wherein performing said at least one etching process to form said air gap results in the formation of a continuous air gap that extends along substantially an entirety of said opposing lateral sidewalls and around one of said opposing end walls of said vertically-oriented channel semiconductor structure.

6. The method of claim 1, further comprising forming a conductive bottom source/drain contact that extends through said replacement bottom spacer and is conductively coupled to a bottom source/drain region formed in said substrate.

7. The method of claim 1, wherein, prior to performing said at least one etching process, the method further comprises forming a protective insulating spacer on at least said gate structure.

8. The method of claim 1, wherein forming said replacement bottom spacer comprises forming said replacement bottom spacer such that it has a vertical thickness that is greater than a vertical thickness of said air gap and such that a portion of said replacement bottom spacer contacts a material formed around said vertically-oriented channel semiconductor structure so as to seal said air gap.

9. A method of forming a vertical transistor, comprising:
   forming an initial bottom spacer above a semiconductor substrate and adjacent a vertically-oriented channel semiconductor structure;
   forming a gate structure around said vertically-oriented channel semiconductor structure and above said initial bottom spacer, wherein said gate structure exposes a portion of said initial bottom spacer;
   performing at least one anisotropic etching process so as to remove said exposed portion of said initial bottom spacer that is not covered by said gate structure, thereby leaving a remaining portion of said initial bottom spacer positioned vertically under said gate structure;
   performing at least one isotropic etching process to remove at least a portion of said remaining portion of said initial bottom spacer so as to thereby result in the formation of an air gap that is positioned under said gate structure, wherein said air gap extends around at least a majority of a perimeter of said vertically-oriented channel semiconductor structure; and
   forming a replacement bottom spacer above said semiconductor substrate and adjacent said air gap, wherein said replacement bottom spacer has a vertical thickness that is greater than a vertical thickness of said air gap.

10. The method of claim 9, wherein, prior to performing said at least one anisotropic etching process, the method further comprises forming a protective insulating spacer on at least sidewalls of said gate structure.

11. The method of claim 10, wherein forming said replacement bottom spacer comprises forming said replacement bottom spacer such that it contacts said protective insulating spacer so as to seal said air gap.

12. The method of claim 9, wherein, after performing said at least one isotropic etching process, said remaining portion of said initial bottom spacer remains positioned under a portion of said gate structure adjacent an end surface of said vertically-oriented channel semiconductor structure.

13. The method of claim 9, wherein performing said at least one isotropic etching process removes substantially all of said remaining portion of said initial bottom spacer such that said air gap extends around an entirety of said perimeter of said vertically-oriented channel semiconductor structure.

14. The method of claim 9, wherein said vertically-oriented channel semiconductor structure comprises opposing lateral sidewalls and opposing end walls and wherein performing said at least one isotropic etching process to form said air gap results in the formation of a continuous air gap that extends along substantially an entirety of said opposing lateral sidewalls and around one of said opposing end walls of said vertically-oriented channel semiconductor structure.

\* \* \* \* \*